(12) United States Patent
Palmer et al.

(10) Patent No.: US 7,924,072 B2
(45) Date of Patent: Apr. 12, 2011

(54) EXACT FREQUENCY TRANSLATION USING DUAL CASCADED SIGMA-DELTA MODULATOR CONTROLLED PHASE LOCK LOOPS

(75) Inventors: Wyn Terence Palmer, Greensboro, NC (US); Kenny Gentile, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 163 days.

(21) Appl. No.: 12/371,262

(22) Filed: Feb. 13, 2009

(65) Prior Publication Data

US 2010/0123491 A1    May 20, 2010

Related U.S. Application Data

(60) Provisional application No. 61/114,676, filed on Nov. 14, 2008, provisional application No. 61/114,697, filed on Nov. 14, 2008.

(51) Int. Cl.
*H03L 7/06*    (2006.01)
(52) U.S. Cl. .......................... 327/156; 327/147; 327/105
(58) Field of Classification Search .................. 327/159, 327/156, 147, 150
See application file for complete search history.

(56) References Cited

U.S. PATENT DOCUMENTS

| | | | |
|---|---|---|---|
| 4,868,513 A | 9/1989 | Piercy et al. | |
| 5,038,117 A | 8/1991 | Miller | |
| 5,079,521 A | 1/1992 | Gaskell et al. | |
| 5,786,778 A | 7/1998 | Adams et al. | |
| 6,008,704 A * | 12/1999 | Opsahl et al. | 332/127 |
| 6,249,189 B1 * | 6/2001 | Wu et al. | 331/18 |
| 6,333,678 B1 * | 12/2001 | Brown et al. | 331/2 |
| 6,690,215 B2 * | 2/2004 | McCune et al. | 327/156 |
| 7,058,010 B2 | 6/2006 | Chidambaran et al. | |
| 7,148,753 B1 | 12/2006 | Garlepp et al. | |
| RE40,424 E | 7/2008 | Han et al. | |
| 7,405,628 B2 * | 7/2008 | Hulfachor et al. | 331/11 |

(Continued)

FOREIGN PATENT DOCUMENTS

EP        1467488        10/2004

OTHER PUBLICATIONS

PCT International Search Report for PCT/US2009/064141 mailed on Jan. 25, 2010.

(Continued)

*Primary Examiner* — Lincoln Donovan
*Assistant Examiner* — Ryan C Jager
(74) *Attorney, Agent, or Firm* — Kenyon & Kenyon LLP

(57) ABSTRACT

A PLL-based frequency translator provides a divider augmented with a sigma delta modulator (SDM) in a reference path. The system may include two primary functional blocks—an input PLL with its reference path containing an integer divider coupled with a SDM (a fractional frequency divider), and an output PLL with its feedback path containing an integer divider coupled with a SDM (a fractional frequency multiplier). The combination of an integer divider and an SDM yields a fractional divider that divides by N+F/M, where N is the integer portion of the division and F/M is the fractional portion of the division, with M denoting the fractional modulus. Furthermore, since it is desirable to have programmable division factors, it is beneficial to define N, F and M as integers as this simplifies a programming interface when the frequency translator is manufactured as an integrated circuit.

25 Claims, 3 Drawing Sheets

U.S. PATENT DOCUMENTS

| | | | |
|---|---|---|---|
| 7,415,092 B2* | 8/2008 | Itri | 375/376 |
| 7,457,388 B2 | 11/2008 | Van Den Berg | |
| 7,656,791 B1 | 2/2010 | Mok et al. | |
| 2002/0141344 A1 | 10/2002 | Chidambaran et al. | |
| 2003/0067405 A1 | 4/2003 | Keaveney et al. | |
| 2003/0119466 A1* | 6/2003 | Goldman | 455/260 |
| 2003/0227301 A1* | 12/2003 | Lee | 327/105 |
| 2004/0036509 A1 | 2/2004 | Smith | |
| 2005/0046491 A1 | 3/2005 | Smith | |
| 2005/0149775 A1 | 7/2005 | Van Den Berg | |
| 2005/0213697 A1* | 9/2005 | Adachi et al. | 375/376 |
| 2006/0139081 A1 | 6/2006 | Van Den Berg | |
| 2007/0024382 A1* | 2/2007 | Zachan et al. | 331/34 |
| 2008/0143397 A1 | 6/2008 | Xia | |
| 2008/0238498 A1* | 10/2008 | Lam et al. | 327/117 |
| 2008/0246521 A1 | 10/2008 | Feng | |
| 2009/0174492 A1 | 7/2009 | Zhang | |
| 2009/0195275 A1 | 8/2009 | Friedman et al. | |
| 2009/0256601 A1 | 10/2009 | Zhang et al. | |
| 2010/0091688 A1 | 4/2010 | Staszewski | |

OTHER PUBLICATIONS

PCT International Search Report for PCT/US2009/064178 mailed on Jan. 21, 2010.

* cited by examiner

100

200

300

400

EXACT FREQUENCY TRANSLATION USING DUAL CASCADED SIGMA-DELTA MODULATOR CONTROLLED PHASE LOCK LOOPS

CROSS REFERENCE TO RELATED APPLICATIONS

The present invention is related to and benefits from the priority of two provisional applications, a first entitled "Exact Frequency Translation Using Dual Cascaded Sigma-Delta Modulator Controlled PLLs," Ser. No. 61/114,676, and a second entitled "Multiple Input PLL With Hitless Switchover Between Non-Integer Related Input Frequencies," Ser. No. 61/114,697, which are incorporated by reference herein and to which priority is claimed. Both applications were filed Nov. 14, 2008.

BACKGROUND

Exact rational frequency translation using a phase locked loop (PLL) is well known. However, it has generally been implemented with integer dividers yielding an output/input frequency ratio given by: $F_{OUT}/F_{IN}=B/A$ (A and B are both integers). The integer constraint significantly limits the useful range of ratios, because $F_{OUT}$ is bounded by the range of the PLL's internal frequency source (typically a VCO). The bound on $F_{OUT}$ limits the usefulness of the B/A integer divide ratios. A further constraint on the usefulness of this approach is that $F_{IN}/A$ must be sufficiently large to ensure that the input PLL phase margin is not compromised due to an excessively low PFD update rate. Generally, it is desirable to have the A and B dividers be programmable in order to support a range of $F_{OUT}/F_{IN}$ ratios. A problem arises, however, when the A and/or B dividers lack sufficient depth to satisfy a particular $F_{OUT}/F_{IN}$ ratio.

Accordingly, there is a need in the art for a frequency translator that can perform a wide range of conversion ratios and, in particular, such a translator that can perform frequency conversion according to non-integral ratios.

DETAILED DESCRIPTION

Embodiments of the present invention provide a PLL-based frequency translator in which integer division is augmented with a sigma delta modulator in a reference path. The system may include two primary functional blocks—an input PLL with its reference path containing an integer divider coupled with a SDM (a fractional frequency divider), and an output PLL with its feedback path containing an integer divider coupled with a SDM (a fractional frequency multiplier). The combination of an integer divider and an SDM yields a fractional divider that divides by N+F/M, where N is the integer portion of the division and F/M is the fractional portion of the division, with M denoting the fractional modulus. Furthermore, since it is desirable to have programmable division factors, it is beneficial to define N, F and M as integers as this simplifies the programming interface when the frequency translator is manufactured as an integrated circuit.

Figure 1:
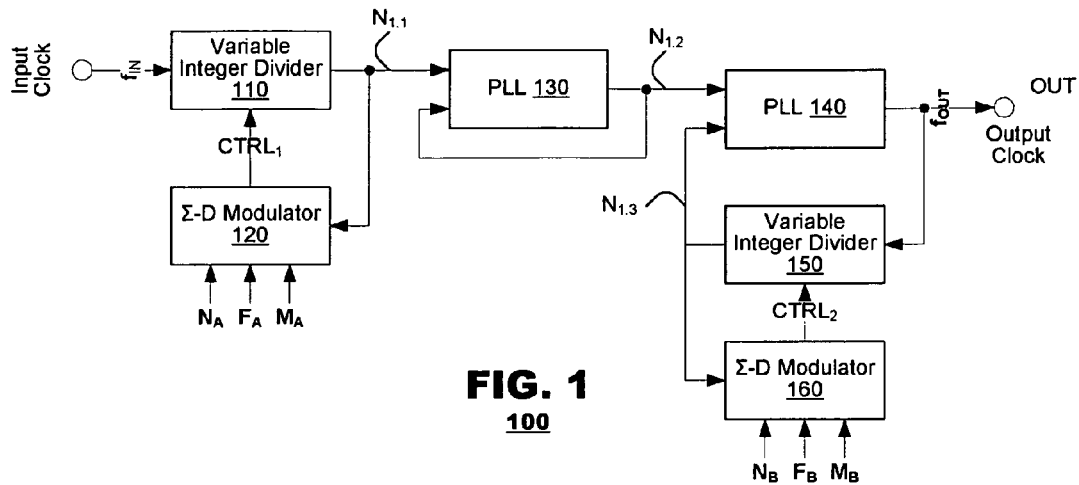
FIG. 1 is a block diagram of a frequency translator according to an embodiment of the present invention.

FIG. 1 is a block diagram of a frequency translator 100 according to an embodiment of the present invention. The frequency translator 100 may include a variable integer divider 110, a sigma delta modulator (SDM) 120, a pair of PLLS 130, 140, a second variable integer divider 150 and a second SDM 160. The frequency translator 100 performs an overall frequency conversion upon the input clock and generates an output clock whose frequency is determined by:

$$f_{OUT} = f_{IN} \left[ \frac{N_B + \frac{F_B}{M_B}}{N_A + \frac{F_A}{M_A}} \right] \quad \text{Eq. 1}$$

where $N_A$, $F_A$, $M_A$ and $N_B$, $F_B$, $M_B$ are programmable integer values.

The first divider 110 accepts an input clock at an input terminal having an input frequency $F_{IN}$ and generates a frequency converted output signal at node $N_{1.1}$. The first SDM 120 outputs a control signal $CTRL_1$ to the first integer divider 110 that controls the ratio of frequency division that is performed by the first divider 110. The first SDM 120 is controlled by respective control signals $N_A$, $F_A$ and $M_A$.

A PLL 130 accepts the frequency converted clock at node $N_{1.1}$ and outputs a second clock at node $N_{1.2}$. The frequencies of the clock signals at nodes $N_{1.1}$ and $N_{1.2}$ are the same.

The second PLL 140 receives the clock signal at node $N_{1.2}$ as its input. It generates a frequency upconverted clock at the output terminal OUT based on a frequency conversion operation performed by the second divider 150 provided in a feedback path of the second PLL 140. The variable integer divider 150 divides the clock signal down by a factor determined by a control signal $CTRL_2$ provided by the second SDM 160. The second SDM 160 generates the control signal to the second integer divider 150 in response to respective control signals $N_B$, $F_B$ and $M_B$.

The paired integer dividers and SDMs yield fractional dividers that divides an input clock signal by N+(F/M), where N is the integer portion of the division and F/M is the fractional portion of the division, with M denoting the fractional modulus. Thus, the first integer divider 110 generates an output clock at node $N_{1.1}$ with a frequency:

$$f_{N1.1} = \frac{f_{IN}}{N_A + \frac{F_A}{M_A}}.$$

Similarly, the second integer divider 150 generates an output clock at node $N_{1.3}$ with a frequency:

$$f_{N1.3} = \frac{f_{OUT}}{N_B + \frac{F_B}{M_B}}.$$

The second integer divider is provided in a feedback path of the second PLL 140 and, therefore, the PLL 140 causes a frequency conversion between node $N_{1.2}$ and the output node as:

$$f_{OUT} = f_{N1.2}\left(N_B + \frac{F_B}{M_B}\right).$$

The frequency translator 100, therefore, performs an overall frequency conversion upon the input clock and generates an output clock whose frequency is determined by Eq. 1.

Traditional frequency converters have performed frequency translation as a rational process (e.g., $F_{OUT}=B/A*F_{IN}$, where A and B are integers) but the integer constraint $F_{OUT}$ has been bounded by the range of the PLL's internal frequency source (typically a VCO). The bound on $F_{OUT}$ limits the usefulness of the B/A integer divide ratios. A further constraint on the usefulness of the traditional approach is that $F_{IN}/A$ must be sufficiently large to ensure that the input PLL phase margin is not compromised due to an excessively low phase-frequency detector (PFD) update rate.

The frequency converter 100 shown in FIG. 1 achieves exact rational frequency translation with an extended range of frequency translation ratios. Thus, it applies to a wider range of input frequencies and output frequencies than has been possible by traditional systems. Moreover, the intermediate frequencies $f_{N1.1}$, $f_{N1.2}$ are higher than the downconverted frequencies used in conventional PLLs which makes clean up of jitter due to the first PLL 130 and removal of external reference noise quite simple.

Figure 2:
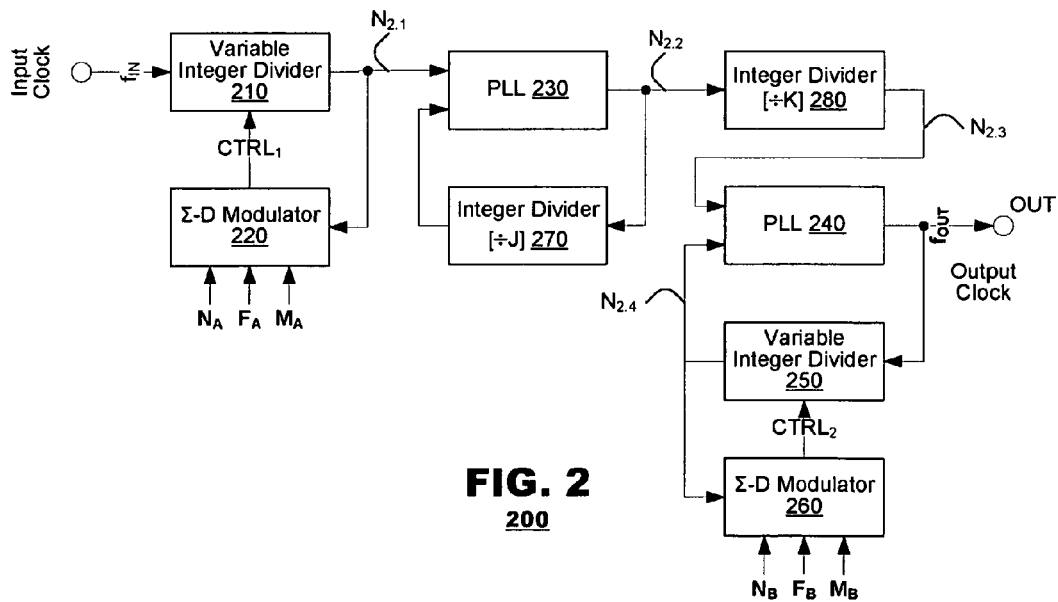
FIG. 2 is a block diagram of a frequency translator according to another embodiment of the present invention.

FIG. 2 illustrates a block diagram of a frequency translator 200 according to another embodiment of the present invention. The frequency translator 200 may include a first variable integer divider 210, a first SDM 220, a pair of PLLS 230, 240, a second variable integer divider 250, a second SDM 260 and a pair of integer dividers 270, 280. The frequency translator 200 performs an overall frequency conversion upon an input clock and generates an output clock whose frequency is determined by:

$$f_{OUT} = f_{IN}\left(\frac{J}{K}\right)\left[\frac{N_B + \frac{F_B}{M_B}}{N_A + \frac{F_A}{M_A}}\right] \qquad \text{Eq. 2}$$

where $N_A$, $F_A$, $M_A$ and $N_B$, $F_B$, $M_B$ are programmable integer values. Optionally, factors J and K also can be made programmable values but, for ease of implementation and because the $N_A$, $F_A$, $M_A$ and $N_B$, $F_B$, $M_B$ values provide sufficient programming flexibility, factors J and K can be set as fixed values when the frequency translator is fabricated as an integrated circuit.

The first divider 210 accepts an input clock at an input terminal having an input frequency $F_{IN}$ and generates a frequency converted output signal at node $N_{2.1}$. The first SDM 220 outputs a control signal $CTRL_1$ to the first integer divider 210 that controls the ratio of frequency division that is performed by the first divider 210. The first SDM 220 is controlled by programmable control signals $N_A$, $F_A$ and $M_A$.

A PLL 230 accepts the frequency converted clock at node $N_{2.1}$ and outputs a second clock at node $N_{2.2}$. An integer divider 270 may be provided in a feedback path of the first PLL 230 which causes an upconversion of the PLL's input frequency $f_{N2.1}$ by a preprogrammed factor, J ($f_{N2.2}=J*f_{N2.1}$).

A second integer divider 280 may be provided in a communication path between the first PLL 230 and the second PLL 240 which causes a downconversion of the PLL's input frequency $f_{N2.3}$ by another preprogrammed factor, K ($f_{N2.3}=f_{N2.2}/K$).

The second PLL 240 may receive the clock signal at node $N_{2.3}$ as its input. It generates a frequency upconverted clock at the output terminal OUT based on a frequency conversion operation performed by the second divider 250 provided in a feedback path of the second PLL 240. The variable integer divider 250 may divide the clock signal down by a factor determined by a control signal $CTRL_2$ provided by the second SDM 260. The second SDM 260 generates the control signal to the second integer divider 250 in response to respective control signals $N_B$, $F_B$ and $M_B$.

The paired integer dividers and SDMs yield fractional dividers that divides an input clock signal by N+(F/M), where N is the integer portion of the division and F/M is the fractional portion of the division, with M denoting the fractional modulus. Thus, the first integer divider 210 generates an output clock at node $N_{2.1}$ with a frequency:

$$f_{N2.1} = \frac{f_{IN}}{N_A + \frac{F_A}{M_A}}.$$

Similarly, the second integer divider 250 generates an output clock at node $N_{2.4}$ with a frequency:

$$f_{N2.4} = \frac{f_{OUT}}{N_B + \frac{F_B}{M_B}}.$$

The second integer divider is provided in a feedback path of the second PLL 240 and, therefore, the PLL 240 causes a frequency conversion between node $N_{2.3}$ and the output node as:

$$f_{OUT} = f_{N2.3}\left(N_B + \frac{F_B}{M_B}\right).$$

The frequency translator 200, therefore, performs an overall frequency conversion upon the input clock and generates an output clock whose frequency is determined by Eq. 2.

As compared to the embodiment of FIG. 1, the frequency translator 200 provides a lower noise signal to the second PLL 240. The frequency translator 200 allows frequencies along intermediate processing chain (e.g., nodes $N_{2.1}$, $N_{2.2}$, $N_{2.3}$) to be higher than in the FIG. 1 embodiment.

Figure 3:
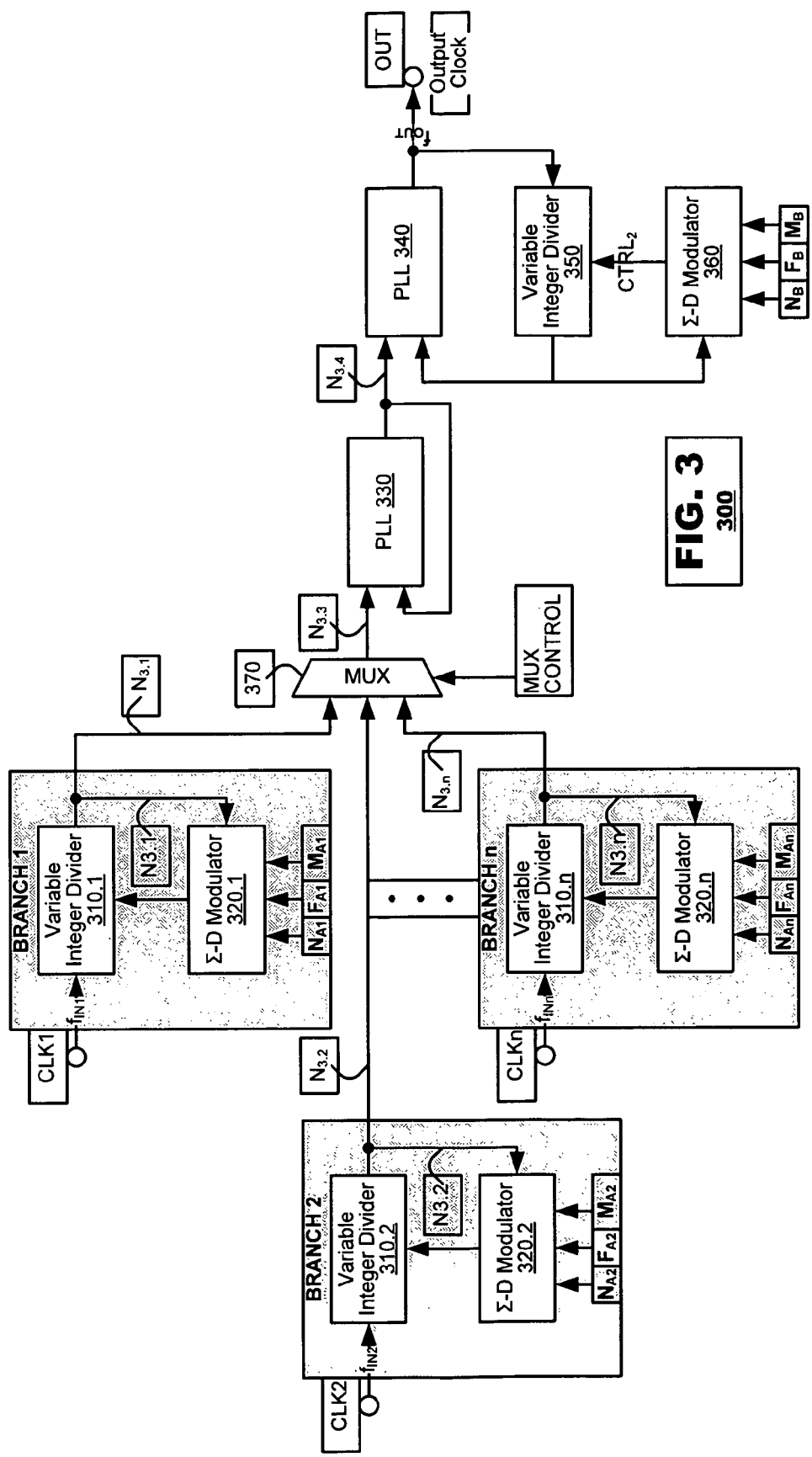
FIG. 3 is a block diagram of a frequency translator according to a further embodiment of the present invention.

FIG. 3 illustrates a frequency translator 300 according to another embodiment of the present invention. In this embodiment, the frequency translator may include a plurality of input branches 1 to n each having an input for a respective clock signal CLK1-CLKn. Each branch (say, branch 1) may include a programmable variable integer divider 310.1 and an SDM 320.1. Thus, each branch may perform a frequency downconversion on its respective input clock according to $$f_{N3.X} = \frac{f_{IN_X}}{N_{AX} + \frac{F_{AX}}{M_{A_X}}},$$

where X represents the respective branch. The frequency translator 300 may include a selection multiplexer to output a clock signal from a respective branch to node $N_{3.3}$ and to further components of the frequency translator 300.

A phase locked loop 330 accepts the frequency converted clock at node $N_{3.3}$ and outputs a second clock at node $N_{3.4}$. In the illustrated embodiment, the frequencies of the clock signals at nodes $N_{3.3}$ and $N_{3.4}$ will be the same. Alternatively, the frequency translator may include fixed integer dividers such as dividers 270, 280 of FIG. 2 (not shown in FIG. 3) to introduce further frequency conversions before the clock signal is input to the second PLL 340.

The second PLL 340 receives the clock signal at node $N_{3.4}$ as its input. It generates a frequency upconverted clock at the output terminal OUT based on a frequency conversion operation performed by the second divider 350 provided in a feedback path of the second PLL 340. The variable integer divider 350 divides the clock signal down by a factor determined by a control signal $CTRL_2$ provided by the second SDM 360. The second SDM 360 generates the control signal to the second integer divider 350 in response to respective control signals $N_B$, $F_B$ and $M_B$. The second integer divider 350 is provided in a feedback path of the second PLL 340 and, therefore, the PLL 340 causes a frequency conversion between node $N_{3.4}$ and the output node as:

$$f_{OUT} = f_{N3.4}\left(N_B + \frac{F_B}{M_B}\right).$$

The frequency translator 300, therefore, performs an overall frequency conversion upon the input clock and generates an output clock whose frequency is determined by:

$$f_{OUT} = f_{INX} \left[ \frac{N_B + \frac{F_B}{M_B}}{N_{AX} + \frac{F_{AX}}{M_{AX}}} \right] \qquad \text{Eq. 3}$$

where $N_{AX}$, $F_{AX}$, $M_{AX}$ and $N_{BX}$, $F_{BX}$, $M_{BX}$ are programmable integer values of each branch X.

The FIG. 3 embodiment is useful in applications where a circuit provides an interface between multiple data sources, each having their own clock domain, and an output. The frequencies of the various input clock signals $CLK_1$-$CLK_n$ need not be related to each other. Each branch is programmable via the $N_{AX}$, $F_{AX}$, $M_{AX}$ parameters (X=1 to n) to divide the frequencies of the input clocks $CLK_1$-$CLK_n$ to a common frequency. That is, regardless of the input clock frequencies, parameters $N_{AX}$, $F_{AX}$, $M_{AX}$ are available to downconvert the input frequencies to a common frequency:

$$f_{N3.3} = \frac{f_{IN1}}{N_{A1} + \frac{F_{A1}}{M_{A1}}} = \frac{f_{IN2}}{N_{A2} + \frac{F_{A2}}{M_{A2}}} = \frac{f_{IN3}}{N_{A3} + \frac{F_{A3}}{M_{A3}}} \qquad \text{Eq. 4}$$

According to an embodiment, the branches may operate continuously and in parallel. Thus, clock signals are available at the inputs of the MUX 370 that have a common frequency. This configuration contributes to seamless switching among the branches because, when the MUX 370 switches from branch to branch as determined by a MUX control signal, the frequencies at all node inputs are identical. No switching latency is incurred when switching branch-to-branch, which is convenient for many data networking applications. No operational changes are required in the downstream elements 330-360 to maintain the output frequency $F_{OUT}$ at a desired frequency.

Figure 4:
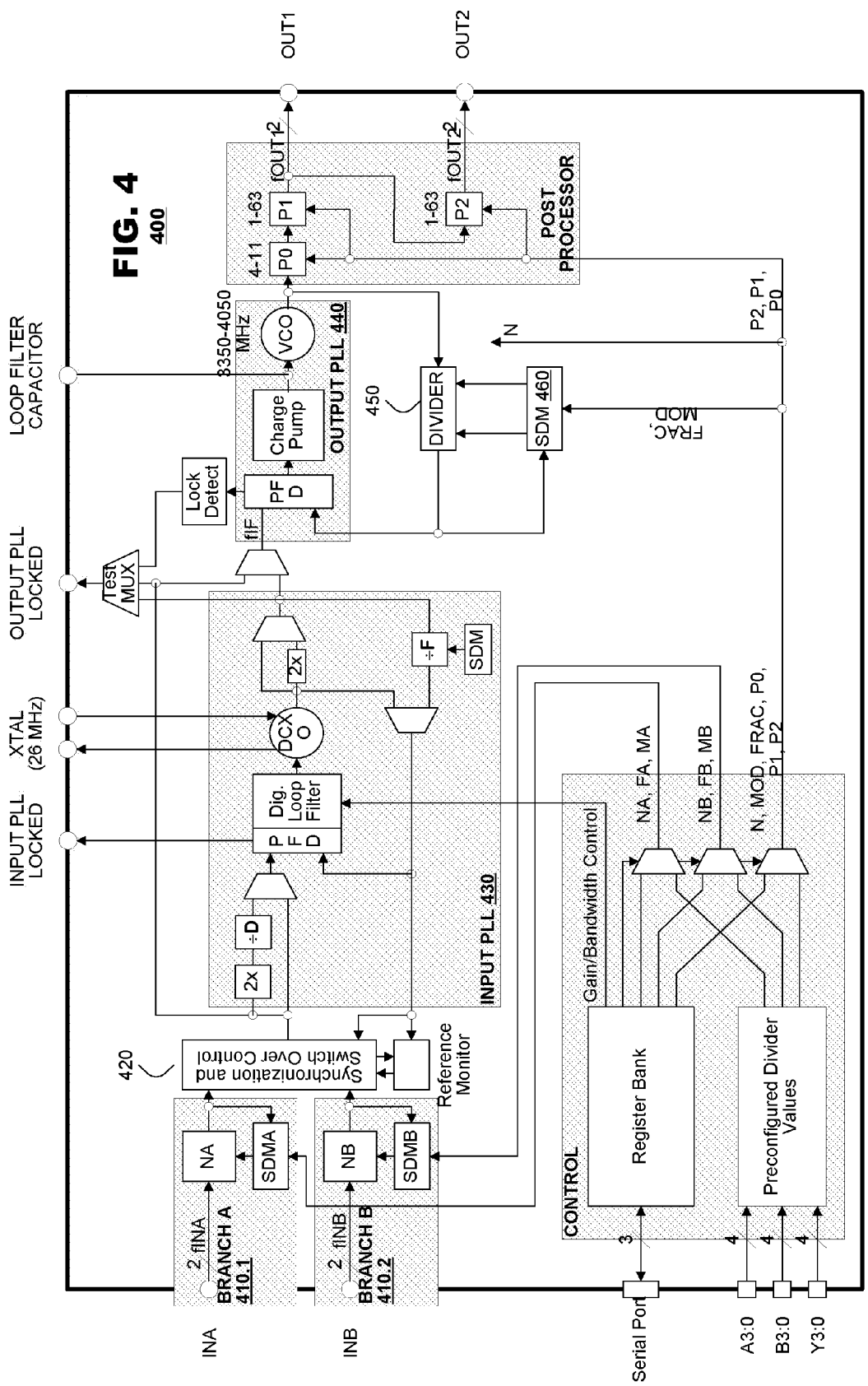
FIG. 4 is a block diagram of a frequency translator according to another embodiment of the present invention.

FIG. 4 illustrates a clock generator that employs fractional-N based phase locked loops (PLL) using sigma-delta modulators (SDMs). The fractional frequency synthesis capability enables the device to meet the frequency and feature requirements for Multiservice switch applications. The FIG. 4 system precisely generates a wide range of standard frequencies when using any one of those same frequencies as a timing base (reference). The primary challenge of this function is the precise generation of the desired output frequency; any inaccuracy in the output frequency will result in system failure as the frequency error eventually results in cycle slippage. This fact necessitates the use of a fractional-N based PLL architecture with variable modulus.

The device architecture consists of two cascaded PLL stages. The first stage consists of fractional division (via SDM) followed by a digital PLL that uses a crystal resonator based DCXO. The DCXO operates in a narrow band within a 20-30 MHz operating range (established by the crystal). This PLL has a loop bandwidth of only a few hertz providing initial jitter cleanup of the input reference signal. The second stage is a frequency multiplying PLL that translates the first stage output frequency (20-30 MHz) up to ~3.7 GHz. This PLL incorporates an SDM-based fractional feedback divider that enables fractional frequency multiplication. Programmable integer dividers follow this second PLL establishing a final output frequency of 778 MHz, or less. It is important to understand that this architecture produces an output frequency that is most likely not coherent with the input reference frequency. As a result, there is generally no relationship between the phase of the input and output signals.

The FIG. 4 system includes reference signal processing blocks that enable a smooth switching transition between two reference inputs. This circuitry automatically detects the presence of the reference input signals. If only one input is present, the device uses it as the active reference. If both are present, one becomes the active reference and the other the backup reference. The circuitry edge-aligns the backup reference with the active reference. If the active reference fails, the circuitry automatically switches to the backup reference (if available) making it the new active reference. Meanwhile, if the failed reference is once again available, it becomes the new backup reference and is edge-aligned with the new active reference (a precaution against failure of the new active reference). In the event that neither reference is useable, the FIG. 4 system supports a holdover mode. The user may provide a 20-30 MHz external crystal to utilize the switchover and holdover functionality, as well as to serve as the clock source for the reference synchronization and monitoring functions.

The FIG. 4 system is easily configured via external control pins (A3:0, B3:0 and Y3:0). The logic state of these pins sets predefined divider values that establish a specific input to output frequency ratio. In addition, any of the divider settings are programmable via the serial programming port, enabling a wide range of input/output frequency ratios under program control.

The FIG. 4 system relies on a single external capacitor for the output PLL loop filter. With proper termination, the output is compatible with LVPECL, LVDS, or HSTL logic levels, though the FIG. 4 system is implemented in a strictly CMOS process.

The FIG. 4 system operates over the extended industrial temperature range of −40° C. to +85° C.

Preset Frequency Ratios

The frequency selection pins (A3:0, B3:0 and Y3:0) allow the user to hardwire the device for preset input and output divider values based on the pin logic states. The A3:0 pins control the REFA dividers, the B3:0 pins the REFB dividers, and the Y3:0 pins the feedback and output dividers. The pins decode ground or open connections as logic 0 or 1, respectively. To change the preset divider settings use the serial I/O port to directly program the divider values.

Table 1 lists the input divider values based on the logic state of the frequency selection pins. The table headings are:

A3:0,B3:0: The logic state of the A3:0 or B3:0 pins.

$N_{A,B}$: The integer part of the REFA input divider ($N_A$) or the REFB input divider ($N_B$).

$MOD_{A,B}$: The modulus of the REFA input divider SDM ($MOD_A$) or the REFB input divider SDM ($MOD_B$).

$FRAC_{A,B}$: The fractional part of the REFA input divider SDM ($FRAC_A$) or the REFB input divider SDM ($FRAC_B$).

$fREF_{A,B}$: The frequency of the REFA input ($fREF_A$) or the REFB input ($fREF_B$).

The indicated divider values cause the frequency at the reference input of the output PLL's PFD ($f_{IF}$) to operate at exactly 26 MHz when using the indicated input reference frequency, $fREF_A$ or $fREF_B$ (assumes the use of an external 26 MHz crystal).

TABLE 1

Preset Input Settings

| A3:0 B3:0 | $N_{A,B}$ | $MOD_{A,B}$ | $FRAC_{A,B}$ | $FREF_{A,B}$ (MHZ) |
|---|---|---|---|---|
| 0000 | 23 | 130,000 | 110,800 | 622.08 |
| 0001 | 24 | 130,000 | −120,000 | 625 |
| 0010 | 24 | 154,050 | −114,594 | $622.08\left(\frac{239}{237}\right) \approx 627.33$ |
| 0011 | 24 | 130,000 | 45,200 | $622.08\left(\frac{66}{64}\right) \equiv 641.52$ |
| 0100 | 24 | 166,400 | 96,400 | $625\left(\frac{66}{64}\right) \equiv 644.53125$ |
| 0101 | 25 | 104,000 | −44,625 | $\frac{10518.75}{16} \equiv 657.421875$ |
| 0110 | 25 | 198,016 | −42,891 | $\frac{10518.75}{16}\left(\frac{239}{238}\right) \approx 660.18$ |
| 0111 | 25 | 154,700 | 41,820 | $622.08\left(\frac{255}{238}\right) \approx 666.51$ |
| 1000 | 25 | 154,050 | 74,970 | $622.08\left(\frac{255}{237}\right) \approx 669.33$ |
| 1001 | 25 | 182,000 | 93,000 | $625\left(\frac{15}{14}\right) \approx 669.64$ |
| 1010 | 25 | 153,400 | 108,120 | $622.08\left(\frac{255}{236}\right) \approx 672.16$ |

TABLE 1-continued

Preset Input Settings

| A3:0 B3:0 | $N_{A,B}$ | $MOD_{A,B}$ | $FRAC_{A,B}$ | $FREF_{A,B}$ (MHZ) |
|---|---|---|---|---|
| 1011 | 26 | 197,184 | 67,998 | $625\left(\frac{255}{237}\right)\left(\frac{66}{64}\right) \approx 693.48$ |
| 1100 | 26 | 146,900 | 83,612 | $622.08\left(\frac{253}{226}\right) \approx 696.40$ |
| 1101 | 27 | 198,016 | −161,755 | $\frac{10518.75}{16}\left(\frac{255}{238}\right) \approx 704.38$ |
| 1110 | 27 | 197,184 | −115,995 | $\frac{10518.75}{16}\left(\frac{255}{237}\right) \approx 707.35$ |
| 1111 | | | | 19.44 MHz input mode |

Pins Y3:0 select the divider values for the feedback path of the output PLL as well as for the OUT1 dividers ($P_0$ and $P_1$). The OUT2 divider, $P_2$, defaults to unity unless otherwise programmed via the serial port. Table 2 and Table 3 list the feedback and output divider values based on the logic state of the Y3:0 frequency selection pins. Table 2 gives the divider values for the normal input mode and Table 3 for the 1944 MHz input mode. The headings for both tables are as follows:

Y3:0: The logic state of the Y3:0 pins.

N: The integer part of the feedback divider.

MOD: The modulus of the feedback SDM.

FRAC: The fractional part of the feedback SDM.

$P_0/P_1$: The $P_0$ and $P_1$ divider values.

$f_{OUT1}$: The frequency of the OUT1 output.

The divider settings shown in Table 2 produce the indicated frequency at OUT1 given that the frequency at the reference input of the output PLL's PFD ($f_{IF}$) is exactly 26 MHz.

TABLE 2

Preset Output Settings, Normal Input Mode

| Y3:0 | N | MOD | FRAC | $P_0/P_1$ | $f_{OUT1}$ (MHz) |
|---|---|---|---|---|---|
| 0000 | 143 | 520,000 | 289,600 | 6/1 | 622.08 |
| 0001 | 144 | 520,000 | 120,000 | 6/1 | 625 |
| 0010 | 144 | 308,100 | 236,736 | 6/1 | $622.08\left(\frac{239}{237}\right) \approx 627.33$ |
| 0011 | 148 | 520,000 | 22,400 | 6/1 | $622.08\left(\frac{66}{64}\right) \equiv 641.52$ |
| 0100 | 148 | 465,920 | 343,840 | 6/1 | $625\left(\frac{66}{64}\right) \equiv 644.53125$ |
| 0101 | 151 | 520,000 | 370,625 | 6/1 | $\frac{10518.75}{16} \equiv 657.421875$ |
| 0110 | 152 | 465,920 | 163,160 | 6/1 | $\frac{10518.75}{16}\left(\frac{239}{238}\right) \approx 660.18$ |
| 0111 | 153 | 465,920 | 377,856 | 6/1 | $622.08\left(\frac{255}{238}\right) \approx 666.51$ |
| 1000 | 154 | 328,640 | 151,168 | 6/1 | $622.08\left(\frac{255}{237}\right) \approx 669.33$ |
| 1001 | 154 | 460,096 | 245,216 | 6/1 | $625\left(\frac{15}{14}\right) \approx 669.64$ |

TABLE 2-continued

Preset Output Settings, Normal Input Mode

| Y3:0 | N | MOD | FRAC | $P_0/P_1$ | $f_{OUT1}$ (MHz) |
|---|---|---|---|---|---|
| 1010 | 155 | 490,880 | 56,192 | 6/1 | $622.08\left(\dfrac{255}{236}\right) \approx 672.16$ |
| 1011 | 133 | 328,640 | 119,005 | 5/1 | $625\left(\dfrac{255}{237}\right)\left(\dfrac{66}{64}\right) \approx 693.48$ |
| 1100 | 133 | 470,080 | 433,856 | 5/1 | $622.08\left(\dfrac{253}{226}\right) \approx 696.40$ |
| 1101 | 135 | 349,440 | 159,975 | 5/1 | $\dfrac{10518.75}{16}\left(\dfrac{255}{238}\right) \approx 704.38$ |
| 1110 | 136 | 394,368 | 11,577 | 5/1 | $\dfrac{10518.75}{16}\left(\dfrac{255}{237}\right) \approx 707.35$ |
| 1111 | 149 | 520,000 | 280,000 | 5/1 | $622.08\left(\dfrac{10}{8}\right) \equiv 777.6$ |

The divider settings shown in Table 3 produce the indicated frequency at OUT1 given that the frequency at the reference input of the output PLL's PFD ($f_{IF}$) is exactly 38.88 MHz.

TABLE 3

Preset Output Settings, 19_4 MHz Input Mode

| Y3:0 | N | MOD | FRAC | $P_0/P_1$ | $f_{OUT1}$ (MHz) |
|---|---|---|---|---|---|
| 0000 | 96 | 777,600 | 0 | 6/1 | 622.08 |
| 0001 | 96 | 777,600 | 350,400 | 6/1 | 625 |
| 0010 | 96 | 460,728 | 373,248 | 6/1 | $622.08\left(\dfrac{239}{237}\right) \approx 627.33$ |
| 0011 | 99 | 777,600 | 0 | 6/1 | $622.08\left(\dfrac{66}{64}\right) \equiv 641.52$ |
| 0100 | 99 | 777,600 | 361,350 | 6/1 | $625\left(\dfrac{66}{64}\right) \equiv 644.53125$ |
| 0101 | 101 | 777,600 | 353,025 | 6/1 | $\dfrac{10518.75}{16} \equiv 657.421875$ |
| 0110 | 101 | 870,912 | 766,638 | 6/1 | $\dfrac{10518.75}{16}\left(\dfrac{239}{238}\right) \approx 660.18$ |
| 0111 | 102 | 465,920 | 399,360 | 6/1 | $622.08\left(\dfrac{255}{238}\right) \approx 666.51$ |
| 1000 | 103 | 328,640 | 95,680 | 6/1 | $622.08\left(\dfrac{255}{237}\right) \approx 669.33$ |
| 1001 | 103 | 435,456 | 148,032 | 6/1 | $625\left(\dfrac{15}{14}\right) \approx 669.64$ |
| 1010 | 103 | 917,568 | 668,736 | 6/1 | $622.08\left(\dfrac{255}{236}\right) \approx 672.16$ |
| 1011 | 89 | 819,072 | 149,467 | 5/1 | $625\left(\dfrac{255}{237}\right)\left(\dfrac{66}{64}\right) \approx 693.48$ |
| 1100 | 89 | 878,688 | 489,888 | 5/1 | $622.08\left(\dfrac{253}{226}\right) \approx 696.40$ |
| 1101 | 90 | 322,560 | 188,350 | 5/1 | $\dfrac{10518.75}{16}\left(\dfrac{255}{238}\right) \approx 704.38$ |
| 1110 | 90 | 546,048 | 527,555 | 5/1 | $\dfrac{10518.75}{16}\left(\dfrac{255}{237}\right) \approx 707.35$ |
| 1111 | 100 | 777,600 | 0 | 5/1 | $622.08\left(\dfrac{10}{8}\right) \equiv 777.6$ |

Input Dividers

Each reference input feeds a dedicated reference divider block. The input dividers provide division of the reference frequency in integer steps from 1 to 63. They provide the bulk of the frequency prescaling necessary to reduce the reference frequency to accommodate the bandwidth limitations of both the input and output PLLs.

Input Sigma-Delta Modulators

Each of the two input dividers is coupled with an optional $2^{nd}$ order sigma-delta modulator (SDM) enabling fractional division of the input reference frequency. With both integer and fractional divide capability, the FIG. 4 system can accept two different reference frequencies that span a wide range of possible input frequency ratios.

A typical SDM offers fractional division of the form, N+F/M, where N is the integer part, M is the modulus, and F is the fractional part (F<M). All three parameters are positive integers. The input SDMs are atypical in that they implement fractional division in the form, N+½+F/(2M) with F being a signed integer and |F|<M.

Both SDMs have an integrated pseudorandom binary sequence (PRBS) generator. The PRBS generator serves to suppress spurious artifacts by adding a random component to the SDM output. By default, the PRBS is active in both input SDMS, but the user has the option to disable the PRBSs via Register 1E<2>.

Reference Monitor

The reference monitor verifies the presence/absence of the prescaled REFA and REFB signals (i.e. after division by the input dividers). The status of the reference monitor guides the activity of the synchronization and switchover control logic.

Synchronization/Switchover Control

Reference synchronization occurs after the input reference dividers. The synchronization and switchover functionality relies on the reference monitor logic to control the operation of three delay locked loops (DLLs). The delay block of the three DLLs are identical, so that they exhibit the same time delay for a given delay value setting.

Both the REFA and REFB path have a dedicated DLL (DLL A and DLL B, respectively). DLL A and DLL B are each capable of operating in either an open- or closed-loop mode under the direction of the reference monitor status signals. When the reference monitor selects one of the references as the 'active' reference, the DLL associated with the active reference operates in open-loop mode. While in open-loop mode, the DLL delays the active reference by a constant time interval based on a fixed delay value. So long as one of the references is the active reference, the other is by default the 'alternate' reference. The DLL associated with the alternate reference operates in closed-loop mode. While in closed-loop mode, the DLL automatically adjusts its delay so that the rising edge of the delayed alternate reference is edge aligned with the rising edge of the delayed active reference.

Whenever the reference monitor selects one of the references as the 'active' reference, it switches the output mux to select the output of the DLL associated with the active reference and simultaneously routes the active reference to the reference DLL. The reference DLL automatically measures the period of the active reference (with approximately 250 ps accuracy). When the reference DLL locks, the value of its delay setting (N) represents one period of the active reference. Upon acquiring lock, the reference DLL captures N and divides it by two (N/2 corresponds to a delay value that represents a half-cycle of the active reference). Both DLL A and DLL B have access to the N/2 value generated by the reference DLL.

The following paragraphs describe the typical sequence of events that results from a device reset, power-up, or return from holdover mode. The reference monitor is continuously checking for the presence of the divided REFA and/or REFB signals. If both are available, the device selects REFA as the active reference, which makes REFB the alternate reference by default. If only one of the references is available, then it becomes the active reference making the other the alternate reference (assuming it ever becomes available). In either case, two events occur:
  the output mux selects the output of the active DLL as the source to the input PLL
  the input mux selects the active reference as the source to the reference DLL The reference DLL measures the period of the active reference and produces the required N/2 delay value. When the reference DLL locks, three events occur:
  both DLL A and DLL B are enabled
  the DLL associated with the active reference enters open-loop mode
  the DLL associated with the alternate reference enters closed-loop mode.

This implies that the signal driving the input PLL is the active reference (after division by its input divider) delayed by a half cycle.

Since the alternate DLL is in closed-loop mode, and assuming that the alternate reference is available, the output of the alternate DLL is edge-aligned with the delayed output of the active DLL. Furthermore, the closed-loop operation of the alternate DLL causes its delay value to adjust dynamically so that it maintains nominal edge-alignment with the output of the active DLL. Edge alignment of the active and alternate references is the key to the hitless switchover capability of the FIG. 4 system.

If the reference monitor detects the loss of the active reference, then it initiates three simultaneous operations:
  the output mux selects the output of the alternate DLL
  the alternate DLL holds its most recent delay setting (that is, the delay setting that edge-aligned the output of the alternate DLL with the output of the active DLL).
  the new active reference is connected to the reference DLL in order to measure its period (i.e. a new N/2 value).

It is item 2) above that provides hitless switching between references.

Since the failed alternate reference is assigned to the alternate DLL, then upon its return the alternate DLL (which is in closed loop mode) automatically edge aligns the delayed alternate reference with the delayed active reference. Thus, should the new active reference fail, switchover to the alternate reference occurs in a hitless manner. This method of swapping the functionality of DLL A and DLL B as either active (open-loop) or alternate (closed-loop) allows for continuous hitless switching from one reference to the other as needed (assuming the availability of an alternate reference upon failure of the active reference).

In the event that both references fail, the device enters holdover mode. In this case, the reference monitor holds the DCXO at its last setting prior to the holdover condition and the DCXO free runs at this setting until the holdover condition expires.

Because the synchronization mechanism autonomously switches between references, the user has no way of knowing which reference is currently the active reference. However, the user can force the device to select a specific input reference as the active reference. For example, to force REFA to be the active reference, power down the REFB input receiver by programming the appropriate registers (or simply disconnect the REFB signal source). The absence of a REFB signal will cause to device to perform a hitless switchover to REFA. If REFA were already the active reference, then the absence of REFB results in no action, and REFA remains the active reference. In this way, the user can ensure that REFA is the active reference. Likewise, by using the same procedure but reversing the roles of the two references, the user can force the device to select REFB as the active reference.

Input PLL

Fundamentally, the input PLL is a phase-frequency detector (PFD), digital loop filter and digitally controlled crystal oscillator (DCXO) operating in a closed loop. In addition, it contains two frequency doublers, two integer dividers (D and F), an SDM (associated the F divider) and switching logic.

The configuration of the input PLL depends on several factors. These include the state of the frequency selections pins, the state of the bandwidth control bits (Register 33<7:6>), and the state of the frequency doubler bit (Register 1D<2>). A configuration summary appears in Table 4. The Input Mode column is a function of the A(3:0) and B(3:0) frequency selection pins such that if A(3:0)=1111b or B(3:0)=1111b, then the input mode is $19_{0.4}4$ MHz. Otherwise, the input mode is NORMAL.

TABLE 4

Input PLL configurations

| INPUT MODE | CONTROL SIGNALS REGISTER SETTINGS BIT 7 | BIT 6 | BIT 2 | DCXO FREQEUNCY DOUBLER | CONFIGURATION MUX A, B & C CONTROL SETTINGS A | B | C | D & F DIVIDER SETTINGS D | F | SDM (F-DIVIDER) |
|---|---|---|---|---|---|---|---|---|---|---|
| NORMAL | 0 | 0 | 0 | Disabled | 0 | 0 | 0 | X | X | Disabled |
| NORMAL | 0 | 0 | 1 | Active | 0 | 1 | 0 | X | X | Disabled |
| NORMAL | 0 | 1 | X | Disabled | 1 | 0 | 1 | 4 | 2 | Disabled |
| NORMAL | 1 | 0 | X | Disabled | 1 | 0 | 1 | 8 | 4 | Disabled |
| NORMAL | 1 | 1 | X | Disabled | 1 | 0 | 1 | 16 | 8 | Disabled |
| 19.44 MHz | X | X | X | Active | 1 | 1 | 1 | 5 | 5 | Active |

The DCXO relies on an external crystal as its frequency source. The crystal is typically 26 MHz in the normal input mode and $19_{0.4}4$ MHz in the $19_{0.4}4$ MHz input mode. The control loop of the input PLL adjusts the load capacitance on the crystal resonator to push or pull the nominal crystal frequency over approximately a ±100 ppm range. The control loop allows the DCXO output to lock to the active reference signal. In order to function properly, the FIG. 4 system requires a crystal with a specified load capacitance of 10 pF (see NDK's NX3225SA, for example).

The restricted tuning range of the DCXO has two implications. First, the user should properly choose the divide ratio of the input reference divider in order to establish a frequency that is within the DCXO tuning range. Second, when configuring the FIG. 4 system so that the DCXO is the reference source for the output PLL (default), the jitter/wander associated with the input signal should be low enough to ensure the stability of the DCXO control loop. Generally, the latter implication means that fractional division is a necessity in order to ensure that the input SDMs are active.

The very narrow loop bandwidth of the input PLL (programmable from approximately 3 Hz to 50 Hz) allows the FIG. 4 system to reduce jitter that appears on the input reference signal. This offers improved phase noise performance at the device output by reducing noise that falls within the loop bandwidth of the output PLL (the next stage in the signal chain). Reduced in-band noise delivered to the output PLL results in reduced noise at the final output.

The programming registers allow for bypassing of the entire input PLL section. With the input PLL bypassed the prescaled active input reference signal (after synchronization) routes directly to the PFD of the output PLL. However, even when bypassed the user should still provide an external crystal so that the DCXO is functional, as the reference monitor and reference synchronization blocks use the DCXO output as a clock source.

2× Frequency Multiplier

In normal input mode with the bandwidth control bits in their default state (00b), an optional 2× frequency multiplier is available at the output of the DCXO. This allows the user to take advantage of an increased input frequency delivered to the output PLL, which allows for greater separation between the frequency generated by the output PLL and the associated reference spur. However, increased reference spur separation comes at the expense of the harmonic spurs introduced by the frequency multiplier. As such, beneficial use of the frequency multiplier is application specific.

In normal input mode but with any of the bandwidth control bits set to logic 1, the 2× frequency multiplier is disabled. This is the reason that the divide ratio of the input PLL's F divider is twice that of the D divider when operating in this mode.

When configured for the $19_{0.4}4$ MHz input mode, the device automatically includes the 2× frequency multiplier as part of the input PLL.

Output PLL

The output PLL consists of a PFD, an integrated voltage controlled oscillator (VCO), and a feedback divider with an optional $3^{rd}$ order SDM that allows for fractional divide ratios. The output PLL produces a nominal 3.7 GHz signal phase-locked to the prescaled active input reference signal.

Phase Frequency Detector and Charge Pump

The PFD of the output PLL drives a charge pump that increases, decreases, or holds constant the charge stored on the external loop filter capacitor. The stored charge results in a voltage that sets the output frequency of the VCO. The feedback loop of the PLL causes the VCO control voltage to vary in a way that phase locks the PFD input signals.

The gain of the output PLL is proportional to the current delivered by the charge pump. The device automatically controls the charge pump current based on the prevailing device control settings. However, the user has the ability to override the charge pump current setting, and thereby the PLL gain, via the programming registers.

Loop Filter Capacitor

The output PLL loop filter requires the connection of an external 12 nF capacitor between the LF pin and ground. This value sets the loop bandwidth at ~50 kHz and ensures loop stability over the intended operating parameters of the device.

Voltage Controlled Oscillator

The VCO has 128 frequency bands spanning a range of 3350 MHz to 4050 MHz (3700 MHz nominal). However, the actual operating frequency within a particular band depends on the control voltage that appears on the loop filter capacitor. The control voltage causes the VCO output frequency to vary linearly within the selected band. This frequency variability allows the control loop of the output PLL to synchronize the VCO output signal with the reference signal applied to the PFD.

In normal operation, the device automatically selects the appropriate band as part of its calibration process (invoked via the VCO Control register). However, the user can override the automatically selected VCO frequency band via the VCO Band Control bits in the VCO Control register.

Feedback Divider

The feedback divider enables the output PLL to provide integer frequency multiplication (assuming that the feedback SDM is disabled). The integer factor, N, is variable from 0 to 255 via an 8-bit programming register. However, in practice, the minimum useable value of N is 64 in order to sufficiently reduce the VCO frequency in the feedback path of the output PLL.

Feedback Sigma Delta Modulator

The feedback divider alone provides only integer frequency multiplication. However, the feedback divider is coupled to an optional $3^{rd}$ order SDM providing fractional division, thereby enabling fractional frequency multiplication. The feedback SDM offers fractional division of the form, N+F/M, where N is the integer part (8 bits), M is the modulus (20 bits), and F is the fractional part (20 bits) with all three parameters being positive integers. The feedback SDM makes it possible for the FIG. 4 system to support a wide range of output frequencies with exact frequency ratios relative to the input reference.

PLL Locked Indicators

Both the input and output PLLs provide a status indicator that appears at an external pin. The indicator signifies when the PLL has acquired a locked condition. The input PLL provides the INPUT PLL LOCKED signal and the output PLL provides the OUTPUT PLL LOCKED signal.

Output Dividers

Three integer dividers exist in the output chain. The first divider ($P_0$) yields an integer sub-multiple of the VCO frequency. The second divider ($P_1$) establishes the frequency at OUT1 as an integer sub-multiple of the output frequency of the $P_0$ divider. The third divider ($P_2$) establishes the output frequency at OUT2 as an integer sub-multiple of the OUT1 frequency.

Output Drivers

The user has control over the following output driver parameters via the programming registers:

Logic family and pin functionality
Polarity (for CMOS family, only)
Drive strength
Power down The logic families include LVDS, LVPECL and CMOS. Selection of the logic family is via the mode bits in the OUT1 and OUT2 Driver Control register (see Table 5).

TABLE 5

Output Channel Logic Family and Pin Functionality

| MODE BITS <2:0> | LOGIC FAMILY AND PIN FUNCTIONALITY |
|---|---|
| 000 | CMOS (both pins) |
| 001 | CMOS (positive pin), Tri-State (negative pin) |
| 010 | Tri-State (positive pin), CMOS (negative pin) |
| 011 | Tri-State (both pins) |
| 100 | LVDS |
| 101 | LVPECL |
| 110 | undefined |
| 111 | undefined |

The output drivers use two pins each in order to support the differential signals associated with the LVDS and LVPECL logic families. CMOS, on the other hand, is a single ended signal and requires only one output pin. However, a CMOS output clock is still available on both pins as shown in Table 5.

The user also controls the logic polarity associated with each CMOS output pin via the OUT1 and OUT2 Driver Control registers. The same register also controls whether the output driver uses weak or strong drive capability. For the CMOS family the strong setting simply allows for driving increased capacitive loads. For the LVDS family, the nominal weak and strong drive currents are 3.5 mA and 7 mA, respectively. Furthermore, the user has independent control each output driver with regard to power down.

Note that unless the user programs the device to allow SPI port control of the output drivers, the drivers default to LVPECL or LVDS depending on the logic level on the OUTSEL pin. For OUTSEL=0 both outputs are LVDS and for OUTSEL=1 both outputs are LVPECL. In the default LVDS or LVPECL mode, the user still can control the drive strength via the SPI port.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A frequency translator to perform frequency conversion on an input clock signal, comprising:
a first variable frequency divider having inputs for the input clock signal and for a control signal, the first variable frequency divider performing a frequency conversion upon the input clock signal by a ratio determined by the control signal,
a first sigma delta modulator having an input for parameters representing integer and fractional portions of a frequency conversion ratio to be performed by the first variable frequency divider, the sigma delta modulator generating the control signal to the first variable frequency divider;
a PLL having a first input coupled to an output of the first variable frequency divider, an output and a feedback path extending from the PLL output to a second PLL input,
a second variable frequency divider provided in the feedback path of the PLL, having an input coupled to the PLL output and an output coupled to the second PLL input, having another input for a second control signal, the second variable frequency divider performing a frequency conversion upon the a clock signal at its first input by a ratio determined by the second control signal, and
a second sigma delta modulator having an input for parameters representing integer and fractional portions of a frequency conversion ratio to be performed by the second variable frequency divider, the sigma delta modulator generating the control signal to the second variable frequency divider.

2. The frequency translator of claim 1, further comprising another PLL coupling an output of the first variable frequency divider to the first PLL.

3. The frequency translator of claim 2, further comprising a frequency divider coupling an output of the first PLL to the other PLL, the frequency divider operating according to a predetermined frequency conversion factor.

4. The frequency translator of claim 1, further comprising a frequency divider provided in a feedback path of the PLL, the frequency divider operating according to a predetermined frequency conversion factor.

5. The frequency translator of claim 1, wherein the frequency translator performs a frequency conversion to the input clock signal according to:

$$f_{OUT} = f_{IN}\left[\frac{N_B + \frac{F_B}{M_B}}{N_A + \frac{F_A}{M_A}}\right], \text{ wherein}$$

$f_{IN}$ is the frequency of the input clock signal,
$N_A$, $F_A$, $M_A$ are control parameters of the first sigma delta modulator, and
$N_B$, $F_B$, $M_B$ are control parameters of the second sigma delta modulator.

6. The frequency translator of claim 1, wherein the first variable frequency divider performs a frequency conversion according to the ratio:

$$f = \frac{f_{IN}}{N_A + \frac{F_A}{M_A}}, \text{ wherein}$$

$f_{IN}$ is the frequency of the input clock signal, and
$N_A$, $F_A$, $M_A$ are control parameters of the first sigma delta modulator.

7. The frequency translator of claim 1, wherein the second variable frequency divider performs a frequency conversion according to the ratio:

$$f = \frac{f_{OUT}}{N_B + \frac{F_B}{M_B}}, \text{ wherein}$$

$f_{OUT}$ is the frequency of the clock signal output from the PLL, and
$N_B$, $F_B$, $M_B$ are control parameters of the second sigma delta modulator.

8. The frequency translator of claim 1, further comprising a second PLL and first and second integer dividers,
the first integer divider provided in a feedback path of the second PLL,
the second PLL coupling an output of the first variable frequency divider to an input of the second integer divider,
the second integer divider having an output coupled to an input of the first PLL,
wherein the frequency translator performs a frequency conversion according to:

$$f_{OUT} = f_{IN}\left(\frac{J}{K}\right)\left[\frac{N_B + \frac{F_B}{M_B}}{N_A + \frac{F_A}{M_A}}\right], \text{ wherein}$$

$f_{IN}$ is the frequency of the input clock signal,
$f_{OUT}$ is the frequency of a clock signal output from the frequency translator,
$N_A$, $F_A$, $M_A$ are control parameters of the first sigma delta modulator,
$N_B$, $F_B$, $M_B$ are control parameters of the second sigma delta modulator, and
J and K are division ratios of the first and second integer dividers respectively.

9. The frequency translator of claim 1, wherein the frequency translator is a branch of a multi-channel frequency translator.

10. A frequency translator to perform frequency conversion on an input clock signal, comprising:
a first variable frequency divider having inputs for the input clock signal and for a control signal, the first variable frequency divider performing a frequency conversion upon the input clock signal by a ratio determined by the control signal,
a first sigma delta modulator having an input for parameters representing integer and fractional portions of a frequency conversion ratio to be performed by the first variable frequency divider, the sigma delta modulator generating the control signal to the first variable frequency divider;
a first PLL having an input coupled to an output of the first variable frequency divider, an output and a feedback path
a second PLL having an input coupled to an output of the first PLL, an output and a feedback path extending from the second PLL's output to a second input of the second PLL,
a second variable frequency divider provided in the feedback path of the second PLL, having an input coupled to the PLL output and an output coupled to the second PLL input, having another input for a second control signal, the second variable frequency divider performing a frequency conversion upon the a clock signal at its first input by a ratio determined by the second control signal, and
a second sigma delta modulator having an input for parameters representing integer and fractional portions of a frequency conversion ratio to be performed by the second variable frequency divider, the sigma delta modulator generating the control signal to the second variable frequency divider.

11. The frequency translator of claim 10, further comprising a frequency divider provided in a feedback path of the first PLL, the frequency divider operating according to a predetermined frequency conversion factor.

12. The frequency translator of claim 10, further comprising a frequency divider coupling an output of the first PLL to an input of the second PLL, the frequency divider operating according to a predetermined frequency conversion factor.

13. The frequency translator of claim 10, wherein the frequency translator performs a frequency conversion to the input clock signal according to:

$$f_{OUT} = f_{IN}\left[\frac{N_B + \frac{F_B}{M_B}}{N_A + \frac{F_A}{M_A}}\right], \text{ wherein}$$

$F_{IN}$ is the frequency of the input clock signal,
$N_A$, $F_A$, $M_A$ are control parameters of the first sigma delta modulator, and
$N_B$, $F_B$, $M_B$ are control parameters of the second sigma delta modulator.

14. The frequency translator of claim 10, wherein the first variable frequency divider performs a frequency conversion according to the ratio:

$$f = \frac{f_{IN}}{N_A + \frac{F_A}{M_A}}, \text{ wherein}$$

$F_{IN}$ is the frequency of the input clock signal, and
$N_A$, $F_A$, $M_A$ are control parameters of the first sigma delta modulator.

15. The frequency translator of claim 10, wherein the second variable frequency divider performs a frequency conversion according to the ratio:

$$f = \frac{f_{OUT}}{N_B + \frac{F_B}{M_B}}, \text{ wherein}$$

$F_{OUT}$ is the frequency of the clock signal output from the PLL, and
$N_B$, $F_B$, $M_B$ are control parameters of the second sigma delta modulator.

16. The frequency translator of claim 10, wherein the frequency translator is a branch of a multi-channel frequency translator.

17. A multi-channel frequency translator, comprising:
a plurality of input branches, each comprising:
a first variable frequency divider having an input for a respective clock signal and an input for a control signal, the first variable frequency divider performing a frequency conversion upon the respective clock signal by a ratio determined by the control signal, and
a first sigma delta modulator having an input for parameters representing integer and fractional portions of a frequency conversion ratio to be performed by the first variable frequency divider, the sigma delta modulator generating the control signal to the first variable frequency divider;
a selector to propagate an output signal a variable frequency divider of a selected branch;
a PLL having a first input coupled to an output of the first variable frequency divider, an output and a feedback path extending from the PLL output to a second PLL input,
a second variable frequency divider provided in the feedback path of the PLL, having an input coupled to the PLL output and an output coupled to the second PLL input, having another input for a second control signal, the second variable frequency divider performing a frequency conversion upon the a clock signal at its first input by a ratio determined by the second control signal, and
a second sigma delta modulator having an input for parameters representing integer and fractional portions of a frequency conversion ratio to be performed by the second variable frequency divider, the sigma delta modulator generating the control signal to the second variable frequency divider.

18. The frequency translator of claim 17, wherein the input branches operate continuously in parallel.

19. The frequency translator of claim 17, wherein the input branches perform respective frequency conversions on their input clock signal to generate output clock signals at a common frequency.

20. The frequency translator of claim 17, further comprising another PLL coupling an output of the first variable frequency divider to the first PLL.

21. The frequency translator of claim 17, further comprising a frequency divider coupling an output of the first PLL to the other PLL, the frequency divider operating according to a predetermined frequency conversion factor.

22. The frequency translator of claim 17, further comprising a frequency divider provided in a feedback path of the PLL, the frequency divider operating according to a predetermined frequency conversion factor.

23. The frequency translator of claim 17, wherein the frequency translator performs a frequency conversion to the input clock signal according to:

$$f_{OUT} = f_{INX} \left[ \frac{N_B + \frac{F_B}{M_B}}{N_{AX} + \frac{F_{AX}}{M_{AX}}} \right], \text{ wherein}$$

$f_{INX}$ is the frequency of the input clock signal of the selected branch,
$N_{Ax}$, $F_{Ax}$, $M_{Ax}$ are control parameters of the first sigma delta modulator of the selected branch, and
$N_B$, $F_B$, $M_B$ are control parameters of the second sigma delta modulator.

24. The frequency translator of claim 17, wherein the first variable frequency divider performs a frequency conversion according to the ratio:

$$f = \frac{f_{IN}}{N_A + \frac{F_A}{M_A}}, \text{ wherein}$$

$F_{IN}$ is the frequency of the input clock signal of the selected branch, and
$N_A$, $F_A$, $M_A$ are control parameters of the first sigma delta modulator of the selected branch.

25. The frequency translator of claim 17, wherein the second variable frequency divider performs a frequency conversion according to the ratio:

$$f = \frac{f_{OUT}}{N_B + \frac{F_B}{M_B}}, \text{ wherein}$$

$F_{OUT}$ is the frequency of the clock signal output from the PLL, and
$N_B$, $F_B$, $M_B$ are control parameters of the second sigma delta modulator.

* * * * *